(12) United States Patent
Yin et al.

(10) Patent No.: US 10,707,439 B2
(45) Date of Patent: Jul. 7, 2020

(54) PACKAGING ADHESIVE, PACKAGING METHOD, DISPLAY PANEL AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Chuan Yin, Beijing (CN); Chia Hao Chang, Beijing (CN); Xianjiang Xiong, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 2 days.

(21) Appl. No.: 15/544,329

(22) PCT Filed: Apr. 15, 2016

(86) PCT No.: PCT/CN2016/079368
§ 371 (c)(1),
(2) Date: Jul. 18, 2017

(87) PCT Pub. No.: WO2016/177267
PCT Pub. Date: Nov. 10, 2016

(65) Prior Publication Data
US 2018/0013091 A1 Jan. 11, 2018
US 2018/0219175 A9 Aug. 2, 2018

(30) Foreign Application Priority Data
May 7, 2015 (CN) .......................... 2015 1 0230326

(51) Int. Cl.
H01L 51/52 (2006.01)
H01L 51/56 (2006.01)
H01L 51/00 (2006.01)

(52) U.S. Cl.
CPC ...... H01L 51/5246 (2013.01); H01L 51/0027 (2013.01); H01L 51/56 (2013.01)

(58) Field of Classification Search
CPC . H01L 51/5246; H01L 51/0027; H01L 51/56; H01L 51/5237
See application file for complete search history.

(56) References Cited

U.S. PATENT DOCUMENTS 3,505,498 A * 4/1970 Shevlin ................. H05B 3/262
219/385
5,281,560 A * 1/1994 Francis ..................... C03C 8/24
501/15

(Continued)

FOREIGN PATENT DOCUMENTS

CN 101009314 A 8/2007
CN 101009319 A 8/2007

(Continued)

OTHER PUBLICATIONS

International Search Report, Application No. PCT/CN20161079368, dated Jul. 15, 2016, 2 pps.

(Continued)

Primary Examiner — Steven H Loke
Assistant Examiner — Juanita B Rhodes
(74) Attorney, Agent, or Firm — Armstrong Teasdale LLP

(57) ABSTRACT

The present disclosure provides a packaging adhesive, a packaging method, a display panel, and a display device. The packaging adhesive includes a frit, an organic solvent, and a material with a thermal expansion coefficient larger than that of the frit. Using the packaging adhesive provided (Continued)

by the present disclosure, the thermal expansion coefficient of the packaging adhesive from which the organic solvent is removed may be enhanced by doping the material with a thermal expansion coefficient larger than that of the frit into existing glass cement, so that in a packaging process using laser radiation, an expansion volume of the packaging adhesive when heated is increased. In this way, a gap between the packaging adhesive and an array substrate is effectively reduced, and a packaging effect is improved.

6 Claims, 2 Drawing Sheets

(56) References Cited

U.S. PATENT DOCUMENTS

| | | |
|---|---|---|
| 2007/0176548 A1 | 8/2007 | Kim et al. |
| 2007/0176551 A1* | 8/2007 | Kwak ................ H01L 27/3276 313/512 |
| 2010/0060166 A1* | 3/2010 | Nishinaka ............ H01J 9/385 313/634 |
| 2010/0270919 A1* | 10/2010 | Hubert ................ H01L 51/5246 313/512 |
| 2011/0113828 A1* | 5/2011 | Matsumoto ......... C03C 23/0025 65/33.2 |
| 2011/0209813 A1* | 9/2011 | Shibuya .................... C03C 8/14 156/89.12 |
| 2014/0196502 A1* | 7/2014 | Masuda .................... C03C 3/14 65/32.2 |

FOREIGN PATENT DOCUMENTS

| | | |
|---|---|---|
| CN | 101111950 A | 1/2008 |
| CN | 101312234 A | 11/2008 |
| CN | 103022382 A | 4/2013 |
| CN | 101326608 A | 10/2013 |
| CN | 103367658 A | 10/2013 |
| CN | 104379523 A | 2/2015 |
| CN | 104810484 A | 7/2015 |

OTHER PUBLICATIONS

Written Opinion of ISA, Application No. PCT/CN2016/079368, dated Jul. 15, 2016, 6 pps.: with English translation.

China First Office Action, Application No. 201510230326.8, dated Jul. 5, 2016, 13 pps.: with English translation.

* cited by examiner

PACKAGING ADHESIVE, PACKAGING METHOD, DISPLAY PANEL AND DISPLAY DEVICE

CROSS REFERENCE TO RELATED APPLICATIONS

This patent application is a National Stage Entry of PCT/CN2016/079368 filed on Apr. 15, 2016, which claims the benefit and priority of Chinese Patent Application No. 201510230326.8 filed on May 7, 2015, the disclosures of which are incorporated herein in their entirety as a part of the present application.

BACKGROUND

The present disclosure relates to a field of display, and more particularly, to a packaging adhesive, a packaging method, a display panel, and a display device.

In recent years, as an emerging flat panel display, an organic light-emitting diode (OLED) display has drawn widespread attention. Because of being very sensitive to water vapor and oxygen, an OLED device needs to be packaged so as to be isolated from the water vapor and the oxygen in practical application, and thus the service life of the OLED can be prolonged.

In the existing fabrication process of OLED displays, frit is generally employed to finish packaging between a packaging cover plate and an array substrate. Specifically, firstly glass powder (glass cement) having a low softening point, a width of about 1~2 mm and a thickness of about 6~100 μm is deposited at an edge of the packaging cover plate by way of silk screen printing, then an organic solvent therein is removed by prebaking so that the prebaked glass powder (glass cement) is solidified to form the frit, and then the frit is heated by using laser irradiation to be smelted so as to adhere the packaging cover plate and the array substrate. However, for a large-size panel, a height difference of the formed frit is difficult to be controlled within 1 μm due to difficulties in coating technologies and baking technologies, as shown in FIG. 1. For Region-a' with a larger height after prebaking, a cross section in AA' direction after laser irradiation is as shown in FIG. 2. In this region, a surface of the frit 300' formed on the packaging cover plate 100' can be in contact with that of the array substrate 200', and thus this region is well packaged. For Region-b' with a smaller height after prebaking, the cross section in AA' direction after laser irradiation is as shown in FIG. 3. In this region, a gap is formed between the surface of the frit 300' and that of the array substrate 200', which causes poor packaging.

BRIEF DESCRIPTION

The present disclosure provides a technical solution for solving the problem of poor packaging caused by uneven heights of the formed frits in the prior art.

In one aspect, the present disclosure provides a packaging adhesive, which includes a frit and an organic solvent, and further includes a material with a thermal expansion coefficient larger than that of the frit.

Further, the frit is borosilicate glass, and the material with a thermal expansion coefficient larger than that of the frit is quartz.

Further, in the packaging adhesive, a mass ratio of the quartz to the borosilicate glass ranges from 3:7 to 4:6.

In another aspect, the present disclosure further provides a packaging method, which includes:

S1: applying the packaging adhesive to a packaging area of a first glass substrate; and S2: attaching the first glass substrate to a second glass substrate.

In one embodiment, the Step S1 further includes removing the organic solvent by heating the packaging adhesive to form a packaging layer on the packaging area.

The Step S2 further includes irradiating the packaging layer using laser to form a sealing structure between the first glass substrate and the second glass substrate.

Further, the Step S1 specifically includes applying at least two packaging adhesive in sequence to the packaging area of the first glass substrate, each layer of the packaging adhesive forming one packaging layer after the organic solvent is removed by heating, so as to form at least two packaging layers in stack, wherein for any two packaging layers, a thermal expansion coefficient of the packaging layer formed by the packaging adhesive applied earlier is greater than that of the packaging layer formed by the packaging adhesive applied later.

Further, two layers of packaging layers in stack are formed in Step S1, the thermal expansion coefficient of the packaging layer formed by the packaging adhesive applied earlier ranges from $80\times10^{-7}/°$ C. to $25\times10^{-6}/°$ C., and the thermal expansion coefficient of the packaging layer formed by the packaging adhesive applied later ranges from $30\times10^{-7}/°$ C. to $40\times10^{-7}/°$ C.

Further, a volume ratio of the packaging layer formed by the packaging adhesive applied later to the packaging layer formed by the packaging adhesive applied earlier is greater than or equal to 5:1.

In one embodiment, the volume ratio of the packaging layer formed by the packaging adhesive applied later to the packaging layer formed by the packaging adhesive applied earlier is 6:1.

In still another aspect, the present disclosure further provides a display panel, which includes a first glass substrate and a second glass substrate arranged oppositely. A sealing structure formed by using the packaging adhesive is arranged between the first glass substrate and the second glass substrate.

Further, the sealing structure includes at least two packaging layers in stack, the at least two packaging layers in stack are formed by applying, in sequence, a corresponding number of layers of the packaging adhesive to the packaging area of the first glass substrate and heating. For any two packaging layers in the sealing structure, a thermal expansion coefficient of the packaging layer formed by the packaging adhesive applied earlier is greater than that of the packaging layer formed by the packaging adhesive applied later.

In another aspect, the present disclosure further provides a display device, which includes the above display panel.

Using the packaging adhesive provided by the present disclosure, the thermal expansion coefficient of the packaging adhesive from which the organic solvent is removed may be enhanced by doping a material with a thermal expansion coefficient larger than that of the frit into the existing glass cement, so that in a packaging process using laser irradiation, an expansion volume of the packaging adhesive when being heated is increased. In this way, a gap between the packaging adhesive and an array substrate is effectively reduced, and a packaging effectiveness is improved.

BRIEF DESCRIPTION OF THE DRAWINGS

Simple description of the present disclosure will be made with reference to drawings in order to make technical solutions in the embodiments of the present disclosure more clear. Obviously, drawings to be described hereinafter are merely some embodiments of the present disclosure, and those of ordinary skill in the art may acquire, under the premise of not contributing creative effort, other drawings according to these drawings.

DETAILED DESCRIPTION

Figure 1:
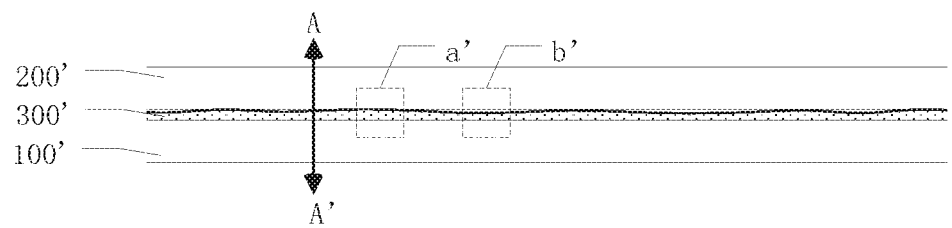
FIG. 1 to FIG. 3 are partial schematic views of a package structure formed using a packaging process in the prior art.
Figure 2:
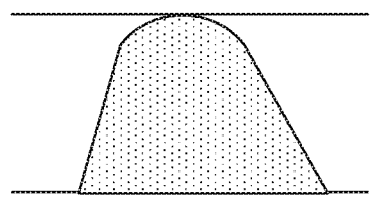
Figure 3:
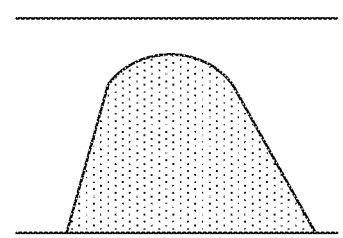

Specific implementations of the present disclosure are further described with reference to the accompanying drawings and the embodiments. The following embodiments are intended to describe the present disclosure but are not intended to limit the scope of the present disclosure. Apparently, the described embodiments are some but not all of the embodiments of the present disclosure. All other embodiments obtained by persons of ordinary skill in the art based on the embodiments described in the present disclosure shall fall within the protection scope of the present disclosure.

Unless otherwise defined, all the technical or scientific terms used herein have the same meanings as commonly understood by one of ordinary skill in the art to which the present disclosure belongs. The terms "first", "second" and so on used in the specification and claims of the present disclosure do not denote any sequence, quantity or importance, but instead are merely used to distinguish different constituent parts. Likewise, the terms such as "a", "an" and so on do not indicate quantitative limitation, but indicate the existence of at least one. The terms "connect" or "connection" and so on are not limited to physical or mechanical connection, and also may include electrical connection, either directly or indirectly. "On," "under," "right," "left" and the like are only used to indicate relative position relationship, and when the absolute position of the object which is described is changed, the relative position relationship may be changed accordingly.

Embodiments of the present disclosure provide a packaging adhesive, which includes a frit and an organic solvent. Moreover, the packaging adhesive further includes a material with a thermal expansion coefficient larger than that of the frit.

Using the packaging adhesive provided by the embodiments of the present disclosure, the thermal expansion coefficient of the packaging adhesive from which the organic solvent is removed may be enhanced by doping a material with a thermal expansion coefficient larger than that of the frit into the existing glass cement, so that in a packaging process using laser irradiation, an expansion volume of the packaging adhesive when being heated is increased. In this way, a gap between the packaging adhesive and an array substrate is effectively reduced, and a packaging effectiveness is improved.

For example, for the glass cement formed by using borosilicate glass as the frit, a quartz material may be added therein, so that the thermal expansion coefficient of the glass cement from which the organic solvent is removed may be enhanced. A mass ratio of the added quartz to the borosilicate glass in the glass cement may range from 3:7 to 4:6, for example, 1:2, 4:5, etc. In the process of using, packaging adhesives having different coefficients of thermal expansion may be obtained by controlling the ratio of the quartz to the borosilicate glass. Specifically, the above selected materials may be added into the glass cement adopted by the traditional packaging process and stirred so that the materials are uniformly distributed in the glass cement. In this way, the above packaging adhesive is prepared and obtained.

Moreover, the embodiments of the present disclosure further provide a method for packaging using the above packaging adhesive, including:

S1: applying the packaging adhesive to a packaging area of a first glass substrate, and forming a packaging layer on the packaging area after the organic solvent therein is removed by heating the applied packaging adhesive, wherein the first glass substrate may be a packaging cover plate in an OLED fabrication process. Specifically, the above packaging adhesive may be applied to the packaging area of the packaging cover plate by using silk screen printing, and then the organic solvent is removed by pre-baking to form the packaging layer.

S2: attaching the first glass substrate to a second glass substrate, and irradiating the packaging layer with laser to form a sealing structure between the first glass substrate and the second glass substrate, wherein the second glass substrate may be an array substrate in the OLED fabrication process, and a plurality of organic light emitting units are formed on the array substrate. Specifically, the packaging cover plate obtained in the above Step S1 is aligned with the array substrate provided with the organic light emitting units and then is heated and cured with laser, so that a sealing structure is formed between the packaging cover plate and the array substrate.

Figure 4:
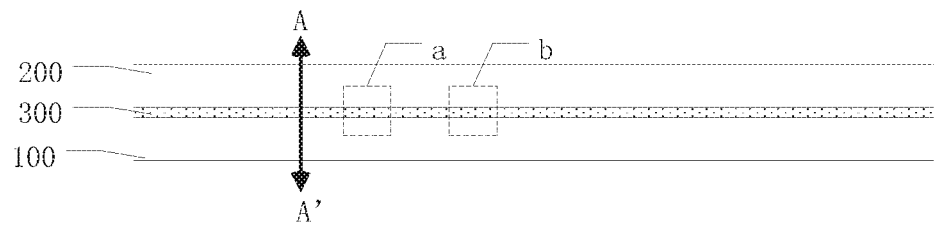
FIG. 4 to FIG. 6 are partial schematic views of a package structure according to embodiments of the present disclosure.
Figure 5:
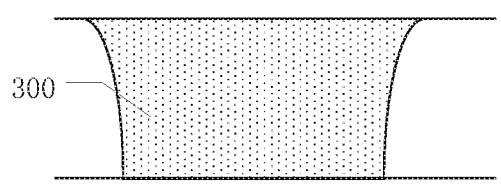
Figure 6:
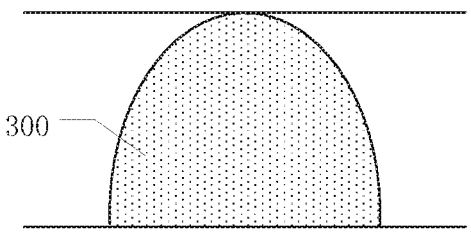

In the prior art, due to difficulties in silk screen printing and baking technologies, after the glass cement is prebaked, it is difficult to control the uniformity within 1 μm. In the present disclosure, by doping the material with a thermal expansion coefficient larger than that of the frit into the existing glass cement, in a packaging process using laser irradiation after prebaking, an expansion volume of the whole packaging adhesive heated can be significantly increased, as shown in FIG. 4. After laser irradiation is performed on a packaging layer 300 between a packaging cover plate 100 and an array substrate 200, for Region-a having a larger height after prebaking, a cross section in the AA' direction after laser irradiation is as shown in FIG. 5. A volume of a colloid in this Region during laser irradiation is significantly increased compared with the prior art, so that a contact area of the colloid and the array substrate 200 is increased. Therefore, a sealing performance of this Region is further improved. Whereas, for Region-b having a smaller height after prebaking, the cross section in the AA' direction after laser irradiation is as shown in FIG. 6. The volume of the colloid is significantly increased when heated, and the height thereof is correspondingly increased compared with the prior art, so that the colloid can come into contact with the array substrate 200, and thus a sealing structure is formed herein.

In one embodiment, in Step S1, at least two layers of the packaging adhesive may be applied in sequence to the packaging area of the first glass substrate, and each layer of the packaging adhesive forms one packaging layer after the organic solvent is removed by heating, so as to form at least two packaging layers in stack. For any two layers of the formed packaging layers, the thermal expansion coefficient of the packaging layer formed by the packaging adhesive applied earlier is greater than that of the packaging layer formed by the packaging adhesive applied later. That is, the thermal expansion coefficient of each packaging layer is greater than that of the packaging layer formed on the surface thereof. During laser heating, the packaging layer having a larger thermal expansion coefficient may apply an outward force to the packaging layer having a smaller thermal expansion coefficient, so that a deformation quantity of the outermost packaging layer is increased, the uniformity of contact of the surface thereof and a second glass substrate is improved, and thus the packaging effect is improved.

Figure 7:
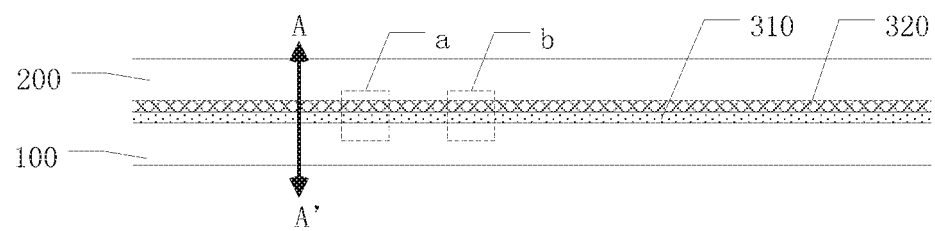
FIG. 7 to FIG. 9 are partial schematic views of another package structure according to embodiments of the present disclosure.
Figure 8:
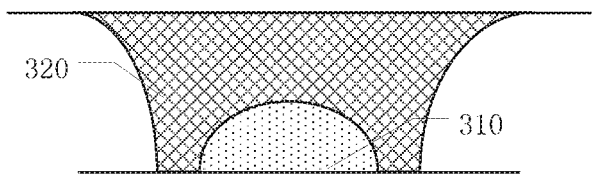
Figure 9:
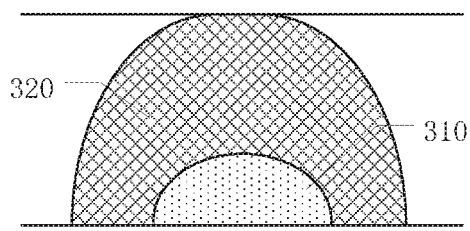

For example, as shown in FIG. 7, two packaging layers 310 and 320 may be formed in sequence on the packaging area of the packaging cover plate 100. The thermal expansion coefficient of the packaging layer 310 formed by the packaging adhesive applied earlier is greater. During laser heating, the packaging layer 310 may apply an outward force to the packaging layer 320 formed by the packaging adhesive applied later, so that a deformation of the packaging layer 320 may be larger than that of a single packaging layer. Therefore, the uniformity of contact of the surface thereof and an array substrate is improved, and thus the packaging effect is improved. FIG. 8 is a schematic sectional view of Region-a in FIG. 7 in AA' direction, and FIG. 9 is a schematic sectional view of Region-b in FIG. 7 in AA' direction. Compared with the solution in which only one packaging layer is formed, the solution of this embodiment with multilayer packaging layers can further improve the packaging effectiveness.

To prevent excessive air pores occurred after laser irradiation at a junction between the packaging layer 310 formed by the packaging adhesive applied earlier and the packaging cover plate (glass material) 100, the thermal expansion coefficient (CTE) of the packaging layer 310 may range from $80 \times 10^{-7}/^\circ$ C. to $25 \times 10^{-6}/^\circ$ C. In addition, to improve the sealing performance after laser irradiation between the packaging layer 320 formed by the packaging adhesive applied later and the array substrate 200, the thermal expansion coefficient of the packaging layer 320 may range from $30 \times 10^{-7}/^\circ$ C. to $40 \times 10^{-7}/^\circ$ C., so that the thermal expansion coefficient of the packaging layer 320 approximates that of the array substrate 200 (glass material), so as to reduce an adverse effect of sealing stress on packaging.

To prevent excessive air pores occurred at the junction because of too much difference between the thermal expansion coefficient of the packaging layer 310 and that of the packaging layer 320, a volume ratio of the packaging layer 320 formed by the packaging adhesive applied later to the packaging layer 310 formed by the packaging adhesive applied earlier may be greater than or equal to 5:1. For example, in one embodiment, the volume ratio may be 6:1, etc.

Moreover, the embodiments of the present disclosure further provide a display panel, which includes a first glass substrate and a second glass substrate arranged oppositely. A sealing structure formed by using the above packaging adhesive is arranged between the first glass substrate and the second glass substrate.

In one embodiment, the sealing structure includes multilayer packaging layers in stack, the multilayer packaging layers in stack are formed by applying, in sequence, a corresponding number of the packaging adhesive to the packaging area of the first glass substrate and then heating. For any two of the packaging layers in the sealing structure, the thermal expansion coefficient of the packaging layer formed by the packaging adhesive applied earlier is greater than that of the packaging layer formed by the packaging adhesive applied later.

Moreover, the present disclosure further provides a display device, which includes the above display panel. The display device provided by the embodiments of the present disclosure may be any product or component having a display function, such as a notebook computer display screen, a TV set, a digital photo frame, a mobile phone, a tablet computer, and so on.

The foregoing embodiments are merely intended for describing the present disclosure, and are not restrictive of the present disclosure. Persons of ordinary skill in the art may make various variations and modifications without departing from the spirit and scope of the present disclosure. Therefore, all equivalent technical solutions also fall within the scope of the present disclosure. And the patent protection scope of the present disclosure shall be limited by the claims.

What is claimed is:

1. A packaging method comprising:
   applying a packaging adhesive to a packaging area of a first glass substrate, wherein the packaging adhesive comprises a frit and an organic solvent and a material, with a thermal expansion coefficient larger than a thermal expansion coefficient of the frit, wherein the frit is borosilicate glass and the material with the thermal expansion coefficient larger than the thermal expansion coefficient of the frit is quartz; and
   attaching the first glass substrate to a second glass substrate facing the first glass substrate,
   wherein applying the packaging adhesive further comprises removing the organic solvent by heating the packaging adhesive to form a packaging layer on the packaging area; and
   attaching the first glass substrate further comprises irradiating the packaging layer using a laser to form a sealing structure between the first glass substrate and the second glass substrate,
   wherein the applying the packaging adhesive further comprises:
   applying at least two layers of the packaging adhesive in sequence to the packaging area of the first glass substrate, each respective layer of the packaging adhesive of the at least two layers of packaging adhesive forming one respective packaging layer after the organic solvent is removed by heating each respective layer of packaging adhesive of the at least two layers of packaging adhesive, so as to form at least two packaging layers in a stack;
   wherein for each respective packaging layer of the at least two packaging layers in the stack, a thermal expansion coefficient of a first packaging layer of the at least two packaging layers in the stack formed by applying at least two layers of the packaging adhesive in sequence is greater than a thermal expansion coefficient of a second packaging layer of the at least two packaging layers in the stack formed by applying at least two layers of the packaging adhesive in sequence.

2. The packaging method according to claim 1, wherein when applying the packaging adhesive to form the at least two packaging layers in the stack, the thermal expansion coefficient of the first packaging layer of the at least two packaging layers in the stack formed by applying the packaging adhesive in sequence ranges from $80 \times 10^{-7}/^\circ$ C. to $25 \times 10^{-6}/^\circ$ C., and the thermal expansion coefficient of the second packaging layer of the at least two packaging layers in the stack formed by applying the packaging adhesive in sequence ranges from $30 \times 10^{-7}/^\circ$ C. to $40 \times 10^{-7}/^\circ$ C.

3. The packaging method according to claim 2, wherein a volume ratio of the second packaging layer of the at least two packaging layers in the stack formed by applying at least two layers of the packaging adhesive in sequence to the first packaging layer of the at least two packaging layers in the stack formed by applying at least two layers of the packaging adhesive in sequence is greater than or equal to 5:1.

4. The packaging method according to claim 3, wherein the volume ratio of the second packaging layer of the at least two packaging layers in the stack formed by applying at least two layers of the packaging adhesive in sequence to the first packaging layer of the at least two packaging layers in the stack formed by applying at least two layers of the packaging adhesive in sequence is 6:1.

5. A display panel comprising a first glass substrate and a second glass substrate arranged opposite one another, wherein a sealing structure formed using a packaging adhesive is arranged between the first glass substrate and the second glass substrate, wherein the packaging adhesive comprises a frit and an organic solvent, wherein the packaging adhesive further comprises a material with a thermal expansion coefficient larger than a thermal expansion coefficient of the frit, wherein the frit is borosilicate glass and the material with the thermal expansion coefficient larger than the thermal expansion coefficient of the frit is quartz, wherein the sealing structure comprises at least two packaging layers in a stack, wherein the at least two packaging layers in the stack are formed by applying, in sequence, a corresponding number of layers of the packaging adhesive to a packaging area of the first glass substrate and heating the corresponding number of layers of the packaging adhesive, and wherein for each respective packaging layer of the at least two packaging layers in the stack in the sealing structure, a thermal expansion coefficient of a first packaging layer of the at least two packaging layers in the stack formed by applying the corresponding number of layers of the packaging adhesive in sequence is greater than a thermal expansion coefficient of a second packaging layer of the at least two packaging layers in the stack formed by applying the corresponding number of layers of the packaging adhesive in sequence.

6. A display device comprising the display panel according to claim 5.

* * * * *